(12) United States Patent
Ito et al.

(10) Patent No.: US 12,312,836 B2
(45) Date of Patent: May 27, 2025

(54) SAFETY SWITCH, AND SWITCH SYSTEM

(71) Applicant: PANASONIC INTELLECTUAL PROPERTY MANAGEMENT CO., LTD., Osaka (JP)

(72) Inventors: Koji Ito, Gifu (JP); Tomohiro Mori, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 82 days.

(21) Appl. No.: 17/755,998

(22) PCT Filed: Nov. 24, 2020

(86) PCT No.: PCT/JP2020/043555
§ 371 (c)(1),
(2) Date: May 13, 2022

(87) PCT Pub. No.: WO2021/149345
PCT Pub. Date: Jul. 29, 2021

(65) Prior Publication Data
US 2022/0390906 A1 Dec. 8, 2022

(30) Foreign Application Priority Data
Jan. 24, 2020 (JP) .................. 2020-010408

(51) Int. Cl.
*E05B 47/06* (2006.01)
*E05B 41/00* (2006.01)
(Continued)

(52) U.S. Cl.
CPC .......... *E05B 47/0603* (2013.01); *E05B 41/00* (2013.01); *E05B 47/00* (2013.01);
(Continued)

(58) Field of Classification Search
CPC .. G05B 9/00; G05B 9/02; G05D 23/24; E05B 7/00; E05B 7/28; E05B 41/00;
(Continued)

(56) References Cited

U.S. PATENT DOCUMENTS 11,377,875 B2 * 7/2022 Martin ................ E05B 47/0012
2004/0210322 A1 10/2004 Takeuchi et al.
(Continued)

FOREIGN PATENT DOCUMENTS

CN 102815584 A 12/2012
CN 105009247 A 10/2015
(Continued)

OTHER PUBLICATIONS

NPL Search (Nov. 7, 2023).*
(Continued)

*Primary Examiner* — Van T Trieu
(74) *Attorney, Agent, or Firm* — WHDA, LLP

(57) ABSTRACT

A safety switch includes a detection unit, an output unit, an input unit; and a display unit. The detection unit is configured to detect presence or absence of abnormality. The output unit is configured to output an abnormality detection signal indicating a detection result of the presence or absence of the abnormality. The input unit is configured to input a display control signal. The display unit is configured to perform display based on the display control signal.

13 Claims, 14 Drawing Sheets

(51) Int. Cl.
  *E05B 47/00* (2006.01)
  *B23Q 11/08* (2006.01)
  *E06B 7/00* (2006.01)
  *G05B 9/02* (2006.01)

(52) U.S. Cl.
  CPC .............. *E05B 47/06* (2013.01); *B23Q 11/08* (2013.01); *E06B 7/00* (2013.01); *G05B 9/02* (2013.01)

(58) Field of Classification Search
  CPC ...... E05B 47/00; E05B 47/06; E05B 47/0603; E05B 9/00; E05B 9/02; E05F 7/00; H01H 35/00; H01H 37/00
  See application file for complete search history.

(56) References Cited

U.S. PATENT DOCUMENTS

| | | |
|---|---|---|
| 2005/0010332 A1 | 1/2005 | Abe et al. |
| 2013/0285666 A1 | 10/2013 | Mohtasham et al. |
| 2014/0054976 A1* | 2/2014 | Ni ............................ F24F 11/66 307/116 |
| 2015/0357140 A1 | 12/2015 | Veil et al. |
| 2016/0146710 A1 | 5/2016 | Nair |
| 2017/0079257 A1* | 3/2017 | Haensgen ............. H04W 76/14 |
| 2019/0096611 A1 | 3/2019 | Papenbreer et al. |
| 2019/0324410 A1 | 10/2019 | Siefert et al. |
| 2020/0327757 A1* | 10/2020 | Kelley ............... G07C 9/00309 |
| 2021/0125440 A1* | 4/2021 | Bossi ..................... E05B 65/46 |

FOREIGN PATENT DOCUMENTS

| | | |
|---|---|---|
| EP | 1 041 336 A2 | 10/2000 |
| JP | 2000-298515 A | 10/2000 |
| JP | 2019-183542 A | 10/2019 |
| JP | 2019-192244 A | 10/2019 |
| KR | 10-2005-0006041 A | 1/2005 |
| KR | 101167979 B1 | 7/2012 |
| SG | 186544 A1 | 1/2013 |
| WO | 02/101475 A1 | 12/2002 |

OTHER PUBLICATIONS

Extended European Search Report dated May 19, 2023 issued in European Patent Application EP 20 91 5812.0.
International Search Report dated Feb. 2, 2021 issued in Patent Application No. PCT/JP2020/043555.
Written Opinion dated Feb. 2, 2021 issued in Patent Application No. PCT/JP2020/043555.
Office Action dated Dec. 8, 2024, issued in counterpart CN Application No. 202080079396.7, with English translation. (27 pages).

* cited by examiner

FIG. 5

| DISPLAY CONTROL SIGNAL | OWN DOOR | DISPLAY MODE |
|---|---|---|
| CLOSED | CLOSED | LIGHTING IN GREEN (DM1) |
| CLOSED | OPEN | ✕ |
| OPEN | CLOSED/ OPEN | LIGHTING IN YELLOW (DM3) |

T1

OR

| DISPLAY CONTROL SIGNAL | OWN DOOR | DISPLAY MODE |
|---|---|---|
| CLOSED | CLOSED | LIGHTING IN GREEN (DM1) |
| CLOSED | OPEN | ✕ |
| OPEN | CLOSED | BLINKING IN GREEN (DM4) |
| OPEN | OPEN | LIGHTING IN RED (DM2) |

T2

SAFETY SWITCH, AND SWITCH SYSTEM

TECHNICAL FIELD

The present disclosure relates to a safety switch and a switch system.

BACKGROUND ART

In the related art, there has been known a safety switch that is attached to a front door of a machine tool, a door portion of a safety fence around an industrial robot, or the like, and detects opening and closing of the door. In this safety switch, a dedicated actuator attached to a door (movable side) is inserted into the safety switch main body by closing the door, and a contact in the main body is switched to transmit a signal. As one of the safety switches, there is known a safety switch including a housing, the housing includes a wireless circuit that supplies power to a wireless tag provided in an actuator and receives a signal transmitted from the wireless tag, and a plurality of display lamps (see Patent Literature 1). The safety switch turns on and off a large display lamp in accordance with an opening and closed state of the actuator, and turns on and off a small display lamp in accordance with an output signal switching device (OSSD) signal or the like.

CITATION LIST

Patent Literature

Patent Literature 1: JP-A-2019-183542

SUMMARY OF INVENTION

Technical Problem

The safety switch in the related art has room for improvement in display of occurrence of abnormality detected by the safety switch.

The present disclosure provides a safety switch and a switch system capable of improving display accuracy of presence or absence of abnormality in consideration of the presence or absence of abnormality detected by another safety switch.

Solution to Problem

An aspect of the present disclosure is a safety switch including a detection unit configured to detect presence or absence of an abnormality, an output unit configured to output an abnormality detection signal indicating a detection result of the presence or absence of the abnormality, an input unit configured to input a display control signal, and a display unit configured to perform display based on the display control signal.

An aspect of the present disclosure is a switch system including a plurality of safety switches, each of the plurality of safety switches being the safety switch, in which the plurality of safety switches include the plurality of safety switches include a first safety switch and a second safety switch, the output unit of the second safety switch outputs, to the first safety switch, the detection result of the presence or absence of the abnormality detected by the detection unit of the second safety switch, and the first safety switch includes a control unit configured outputs the display control signal to the second safety switch based on the detection result of the presence or absence of the abnormality output by the second safety switch.

An aspect of the present disclosure is a switch system including a plurality of safety switches, each of the plurality of safety switches includes: a detection unit configured to detect presence or absence of abnormality; and an output unit configured to output an abnormality detection signal indicating a detection result of the presence or absence of the abnormality, the plurality of safety switches are connected in series, the plurality of safety switches including a first safety switch disposed at a last stage and a second safety switch disposed at a position other than the last stage, the output unit of the first safety switch is configured to output the abnormality detection signal via a duplexed signal line, and the output unit of the second safety switch is configured to output the abnormality detection signal via a single signal line.

Advantageous Effects of Invention

According to the present disclosure, it is possible to improve the display accuracy of the presence or absence of the abnormality in consideration of the presence or absence of the abnormality detected by the other safety switch.

BRIEF DESCRIPTION OF DRAWINGS

FIG. 5 is a diagram showing an example of a display mode by a single light source in the safety switch.

DESCRIPTION OF EMBODIMENTS

Hereinafter, an embodiment will be described in detail with reference to the drawings as appropriate. However, an unnecessary detailed description may be omitted. For example, detailed description of a well-known matter or repeated description of substantially the same configuration may be omitted. This is to avoid unnecessary redundancy in the following description and to facilitate understanding of those skilled in the art. The attached diagrams and the following description are provided for those skilled in the art to sufficiently understand the present disclosure, and are not intended to limit the matters described in the scope of the claims.

Introduction to Contents of Embodiment

The safety switch of Patent Literature 1 can be cascade-connected to other safety switches. In the cascade connection, a plurality of safety switches are connected in series. Each of the safety switches receives a detection signal of the safety switch of a previous stage (upstream side) as an OSSD signal. The detection signal of the safety switch of the previous stage is a detection signal indicating that there is abnormality when the abnormality (for example, an opening state of the door is detected) is detected in at least one of the safety switches up to the previous stage, and is a detection signal indicating that there is no abnormality when no abnormality is detected in all of the safety switches up to the previous stage. Therefore, the safety switch at a subsequent stage of the safety switch having the abnormality can recognize and display that there is the abnormality in other safety switches. In contrast, the safety switch in the previous stage of the safety switch having the abnormality cannot recognize and display that there is the abnormality in other safety switches of the subsequent stage. Therefore, in the safety switch in the related art, display accuracy of the presence or absence of the abnormality in other safety switches may be reduced.

Hereinafter, a safety switch and a switch system, capable of improving display accuracy of presence or absence of abnormality in consideration of the presence or absence of the abnormality detected by other safety switches, are described.

Embodiment

Figure 1:
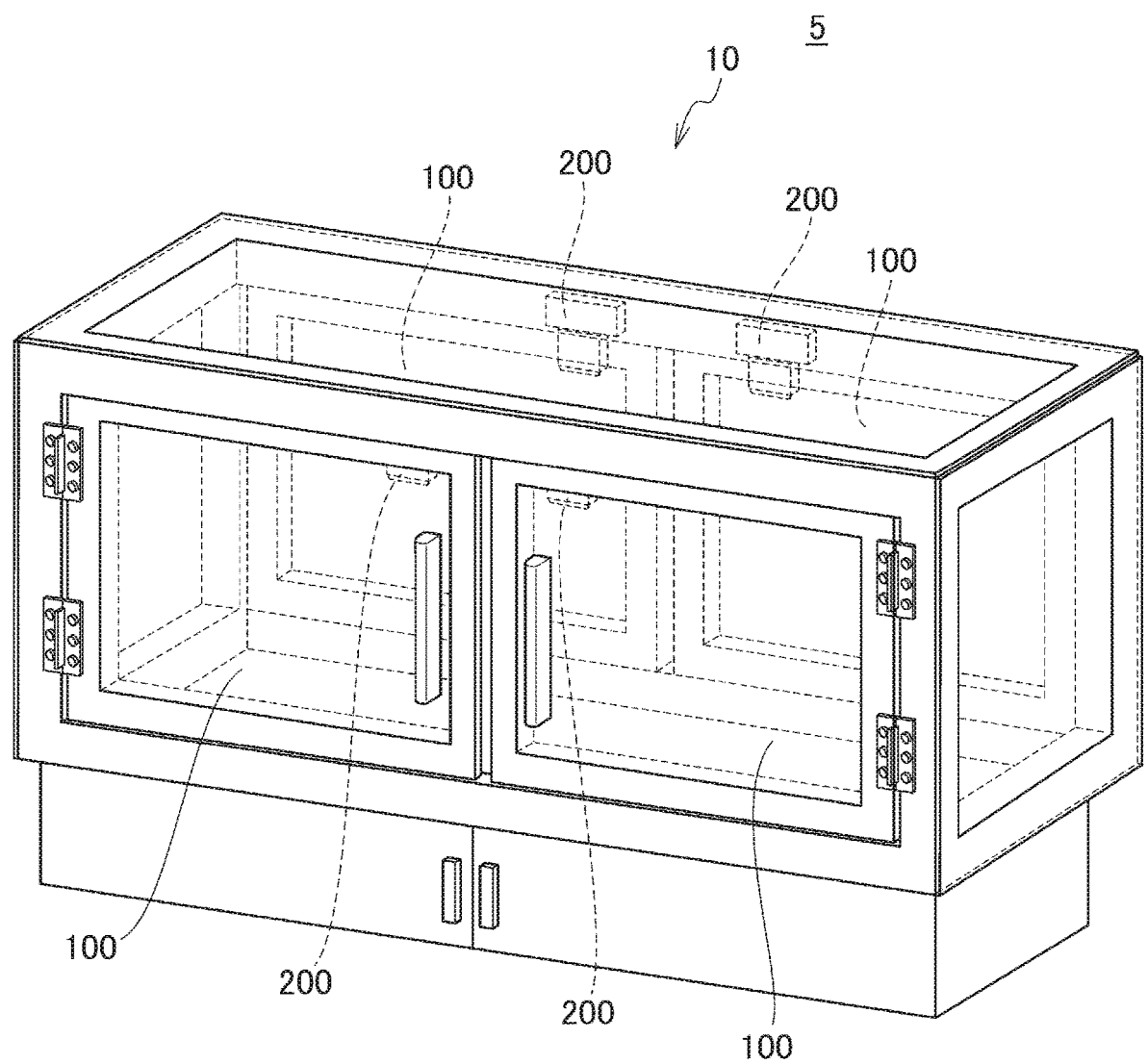
FIG. 1 is a diagram showing a configuration example of a door-equipped apparatus.

FIG. 1 is a diagram showing a configuration example of a door-equipped apparatus 10 according to an embodiment. The door-equipped apparatus 10 includes one or more doors 100 and one or more safety switches 200. The door 100 may widely include those related to a door such as an opening and a gate, and may include a window. The door-equipped apparatus 10 is, for example, a manufacturing apparatus, and, for example, a manufacturing apparatus main body is accommodated inside the door-equipped apparatus 10. Further, a switch system 5 is formed by including the plurality of safety switches 200.

Figure 2:
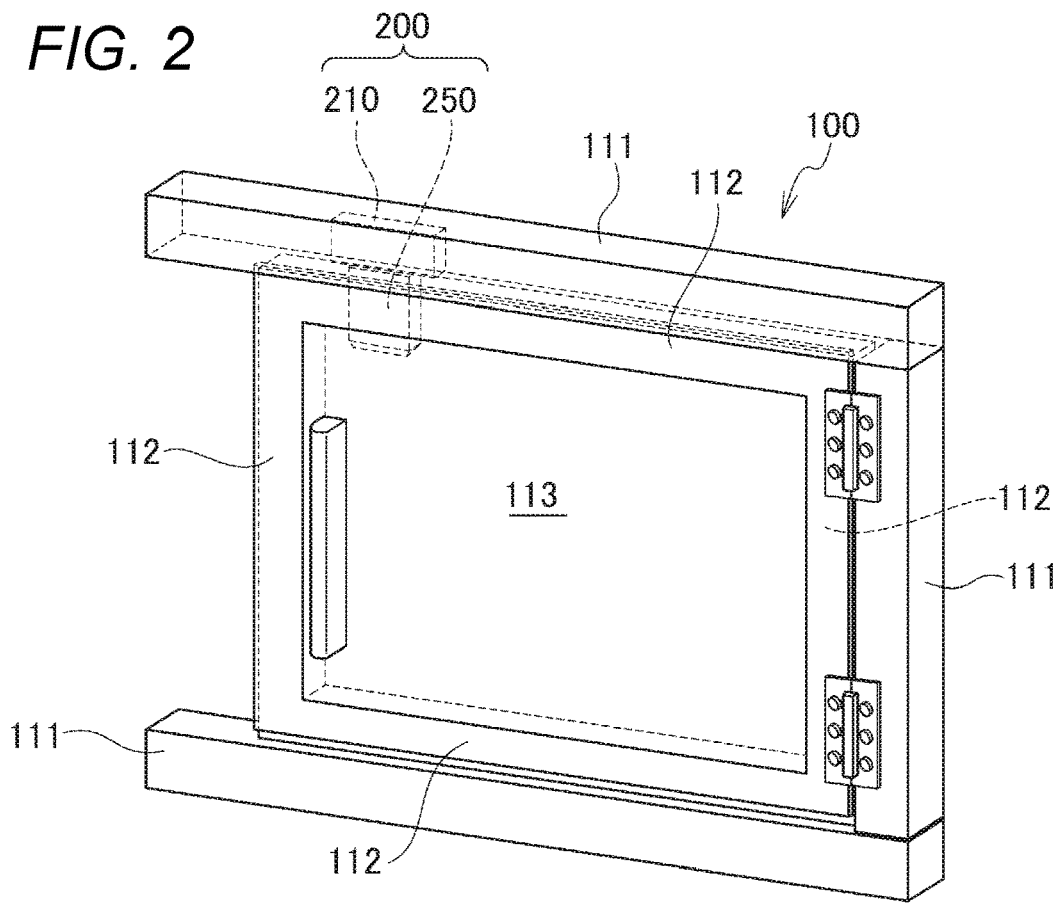
FIG. 2 is a perspective view showing a configuration example of the door.

FIG. 2 is a perspective view showing a configuration example of the door 100. Each of the doors 100 includes a fixed frame 111, a movable frame 112, and a door main body 113.

The fixed frame 111 may be a part of a member that covers an outer periphery of the door-equipped apparatus 10. The fixed frame 111 is, for example, an aluminum frame, and may be a frame formed of other materials. The fixed frame 111 does not have translucency.

The movable frame 112 is movable with respect to the fixed frame 111. As a result, the door 100 can be opened and closed. The movable frame 112 is, for example, an aluminum frame, and may be a frame formed of other materials. The movable frame 112 does not have the translucency.

In the door main body 113, periphery of the door main body 113 is surrounded by the movable frame 112. The door main body 113 is formed of, for example, a light transmissive member. The light transmissive member may be formed of, for example, transparent plastic or glass, and the same applies to the following description of the light transmissive member.

It should be noted that a method of opening and closing the door 100 may include a hinged door method, a sliding door method, a folding door method, a bellows method, a double door method, a gull wing method, and the like.

The safety switch 200 functions as a door sensor that detects opening and closing of the door 100. The safety switch 200 can detect the opening and closing of the door 100 (own door) on which the safety switch 200 is attached, and can also detect the opening and closing of the door 100 (other door) other than the door on which the safety switch 200 is attached. The safety switch 200 may have an interlock function, an external device monitoring (EDM) function, and the like.

The safety switch 200 includes a sensor main body 210 and an actuator 250. The sensor main body 210 is provided on the fixed frame 111 inside the door-equipped apparatus 10. The actuator 250 is provided on the movable frame 112 inside the door-equipped apparatus 10. Therefore, when viewed from a confirmer who confirms from an outside of the door-equipped apparatus 10, the safety switch 200 is located on a rear surface side of the fixed frame 111 and the movable frame 112. The confirmer can confirm display of the safety switch 200 via the door main body 113 as the light transmissive member.

The plurality of safety switches 200 can be connected to each other by any connection method. For example, the plurality of safety switches 200 can be connected in series and connected in cascade. In this case, an order (position) of the series connection may be described by stages. For example, the first safety switch 200 of the series connection may be the safety switch 200 of a first stage, and the last safety switch 200 of the series connection may be the safety switch 200 of a last stage. The safety switch 200 of the last stage is connected to a safety programmable logic controller (PLC).

Figure 3:
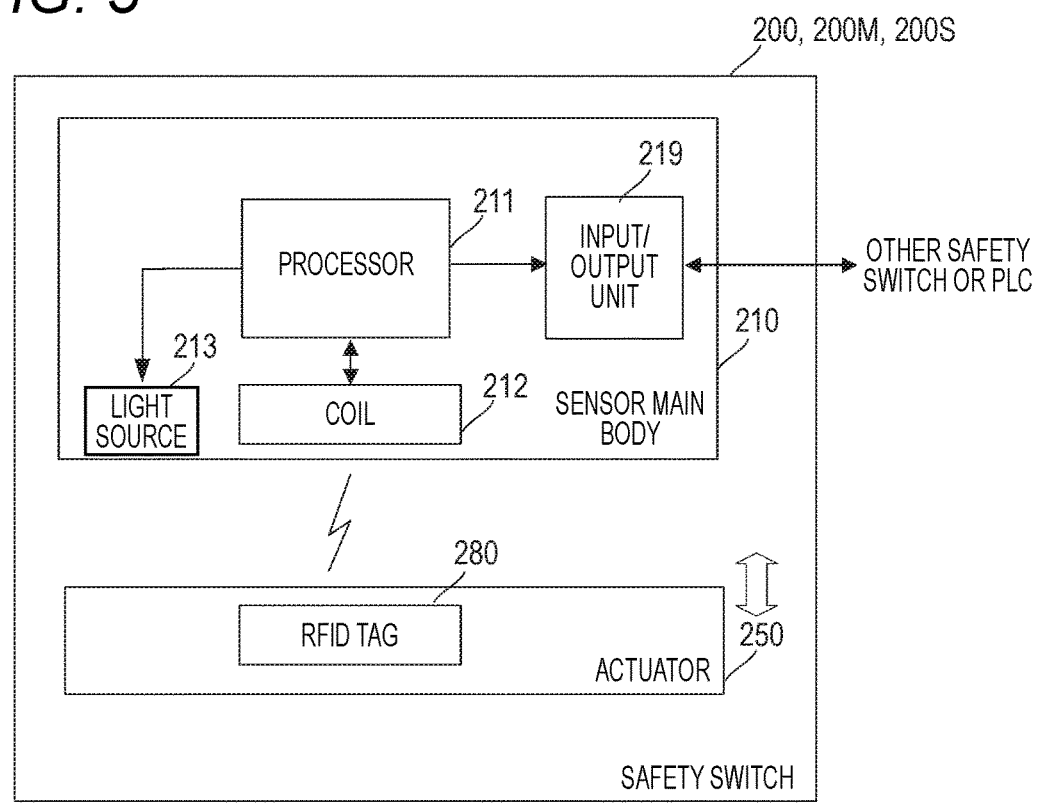
FIG. 3 is a block diagram showing a configuration example of a safety switch.

FIG. 3 is a block diagram showing a configuration example of the safety switch 200. The safety switch 200 includes the sensor main body 210 and the actuator 250. The sensor main body 210 includes a processor 211, a coil 212, a light source 213, and an input/output unit 219. The actuator 250 includes a radio frequency identifier (RFID) tag 280.

The processor 211 implements various functions in cooperation with a memory included in the sensor main body 210. The processor 211 may include a micro processing unit (MPU), a central processing unit (CPU), a digital processor (DSP), and the like. The processor 211 controls an overall operation of the sensor main body 210.

The processor 211 detects whether the own door is closed (closed state) or opened (opening state) based on a state in which the coil 212 of the sensor main body 210 and the RFID tag 280 of the actuator 250 are close to each other. Details of the detection of the opening and closed state of the own door will be described later.

The coil 212 receives power from the outside via the input/output unit 219, and transmits the power to an external device (for example, the actuator 250) by wireless power transmission. The wireless power transmission may be an electromagnetic induction system or a magnetic field resonance system. Upon receiving a predetermined signal from the external device, the coil 212 notifies the processor 211 that the predetermined signal is received. The external device is, for example, the actuator 250, and more specifically, the RFID tag 280 of the actuator 250. The coil 212 detects the closed state (an example of absence of abnormality) by receiving the predetermined signal from the actuator 250, and detects the opening state (an example of presence of abnormality) by not receiving the predetermined signal.

The number of light sources 213 may be one or more. The light source 213 emits (displays) light under the control of the processor 211. The light source 213 may display based on a detection result of the presence or absence of the abnormality of the door 100 (own door) by the safety switch 200 (own switch). The light source 213 may perform display based on the detection result of the presence or absence of the abnormality of another door 100 (another door) by another safety switch 200 (another switch) different from the safety switch 200. The presence or absence of the abnormality of the door 100 may include the opening and closed state of the door 100. The detection result of the presence or absence of the abnormality detected by the safety switch 200 is also simply referred to as a "detection result". The light source 213 can display in various display modes based on at least one of the detection result by the own switch and the detection result by the own switch. The display mode may be a display color, a display pattern (for example, lighting, blinking, and extinguishing), a light intensity, or the like.

The light source 213 may project the light to the actuator 250 through a light projection port of the sensor main body 210 facing the actuator 250. The actuator 250 may receive the projected light, guide the light from the sensor main body 210 via the light transmissive member, and emit (output) visible light. Further, the light source 213 may emit (output) the light directly to the outside of the safety switch 200 without projecting the light to the actuator 250. In any case, it is sufficient that the light emitted from the safety switch 200 can be confirmed from the outside of the door-equipped apparatus 10 via the door main body 113 formed of the light transmissive member.

The input/output unit 219 performs input and output of data, information, and signals with an external device (for example, another switch or the safety PLC). Various signal lines are connected to the input/output unit 219. The input/output unit 219 inputs and outputs (at least one of input and output) signals such as a power supply signal, an abnormality detection signal, and a display control signal via the signal lines. The input/output unit 219 may include the various signal lines.

The power supply signal includes the power supplied to various electric components included in the safety switch 200. The abnormality detection signal indicates the detection result of the presence or absence of the abnormality in another switch connected to the previous stage of the own switch. The abnormality detection signal indicates, for example, the detection result of the opening and closed state of another door on which another switch connected to the previous stage of the own switch is provided. The display control signal is a signal for controlling the display by the light source 213. The display control signal is based on the detection result of the presence or absence of the abnormality by other switches in the previous stage, the own switch, and other switches of the subsequent stage. The display control signal is determined based on, for example, the detection result of the opening and closed state of each of the doors 100 on which each of the safety switches 200 is provided.

The RFID tag 280 is arranged in a range in which the RFID tag 280 can communicate with the coil 212 of the sensor main body 210 when the door 100 is in the closed state. The RFID tag 280 is disposed, for example, on a facing surface side facing the sensor main body 210 when the door 100 is in the closed state. The RFID tag 280 transmits the predetermined signal. The RFID tag 280 is, for example, a passive tag, and operates by receiving the power supply from the outside (for example, the sensor main body 210). For example, the RFID tag 280 receives the power supply from the sensor main body 210 via the coil 212, and transmits the predetermined signal to the sensor main body 210. It should be noted that the predetermined signal may include at least information for identifying the RFID tag 280.

Here, a specific method for detecting the opening and closing of the door 100 will be described.

When the actuator 250 is disposed at a predetermined position with respect to the sensor main body 210, the sensor main body 210 detects the actuator 250. Specifically, when the RFID tag 280 of the actuator 250 is located in a range in which the wireless power transmission from the coil 212 of the sensor main body 210 is possible, the sensor main body 210 supplies the power to the actuator 250, and the actuator 250 transmits the predetermined signal to the sensor main body 210. Upon detecting that the coil 212 receives the predetermined signal from the actuator 250, the coil 212 detects the actuator 250 and notifies the processor 211. Upon receiving this notification, the processor 211 recognizes the actuator 250.

When the sensor main body 210 detects the actuator 250, the processor 211 determines that the movable frame 112 on which the actuator 250 is provided faces the fixed frame 111 on which the sensor main body 210 is provided in a predetermined state, and the door 100 is in the closed state. When the sensor main body 210 does not detect the actuator 250, it is determined that the movable frame 112 on which the actuator 250 is provided does not face the fixed frame 111 on which the sensor main body 210 is provided in the predetermined state, and the door 100 is in the opening state.

Next, the manufacturing apparatus will be described.

The manufacturing apparatus as the door-equipped apparatus 10 is an apparatus that manufactures various products (for example, electrical, mechanical, and chemical substances). The manufacturing apparatus or the product is not limited, and is, for example, a manufacturing apparatus or a product to be handled in consideration. The manufacturing apparatus may operate according to a state of the safety switch 200. For example, when the closed state of all the doors 100 is detected by the safety switch 200, the manufacturing apparatus may be operable, and when the opening state of at least one door 100 is detected by the safety switch 200, the manufacturing apparatus may be inoperable.

Accordingly, the door-equipped apparatus 10 can maintain the manufacturing apparatus or the product in a safe state.

Permission or prohibition of the operation of the manufacturing apparatus according to the state of the safety switch 200 may be performed by the safety PLC. The safety PLC is connected between the safety switch 200 and the manufacturing apparatus main body. The safety PLC may acquire the abnormality detection signal from at least one of the safety switches 200 and determine permission or prohibition of the operation of the manufacturing apparatus based on the abnormality detection signal. For example, a processor of the safety PLC may permit the operation of the manufacturing apparatus when the closed state of all the doors 100 is detected by the safety switch 200, and may prohibit the operation of the manufacturing apparatus when the opening state of at least one of the doors 100 is detected by the safety switch 200.

Although not particularly shown, the safety PLC includes the processor, an input/output unit, and the like. The processor implements various functions in cooperation with a memory included in the safety PLC. The processor may include an MPU, a CPU, a DSP, and the like. The processor controls an overall operation of the safety PLC. The input/output unit performs input and output of data, information, and signals with an external device (for example, the safety switch 200 or the manufacturing apparatus). Various signal lines are connected to the input/output unit. The input/output unit inputs and outputs (at least one of input and output), via the signal lines, signals such as the power supply signal, the abnormality detection signal, the display control signal, and a control signal for controlling the manufacturing apparatus. It should be noted that the safety PLC may be included in the switch system 5.

It should be noted that in FIG. 1, the plurality of doors 100 are provided so as to surround the manufacturing apparatus, the door-equipped apparatus 10 is formed in a rectangular shape in a plan view, and the present disclosure is not limited thereto. For example, the plurality of doors 100 may be arranged in one direction. In this case, the plurality of doors 100 may be linearly arranged in a direction parallel to a surface of the door main body 113, or may be linearly arranged in a direction perpendicular to the surface of the door 100. When the doors 100 are arranged perpendicular to the surface of the door 100, it is assumed that a large number of the doors 100 are arranged in a depth direction when viewed from the confirmer, and it may be difficult to confirm the display of the safety switch 200 arranged on a back side.

Next, classification of the safety switch 200 will be described.

The plurality of safety switches 200 are provided, and are classified into a master switch 200M and a slave switch 200S. The master switch 200M is disposed at the last stage among the plurality of safety switches 200, and is disposed immediately before a safety PLC 400. The slave switch 200S is a safety switch other than the master switch 200M among the plurality of safety switches 200, and is a safety switch adjacent to another safety switch 200 but not adjacent to the safety PLC.

Figure 4:
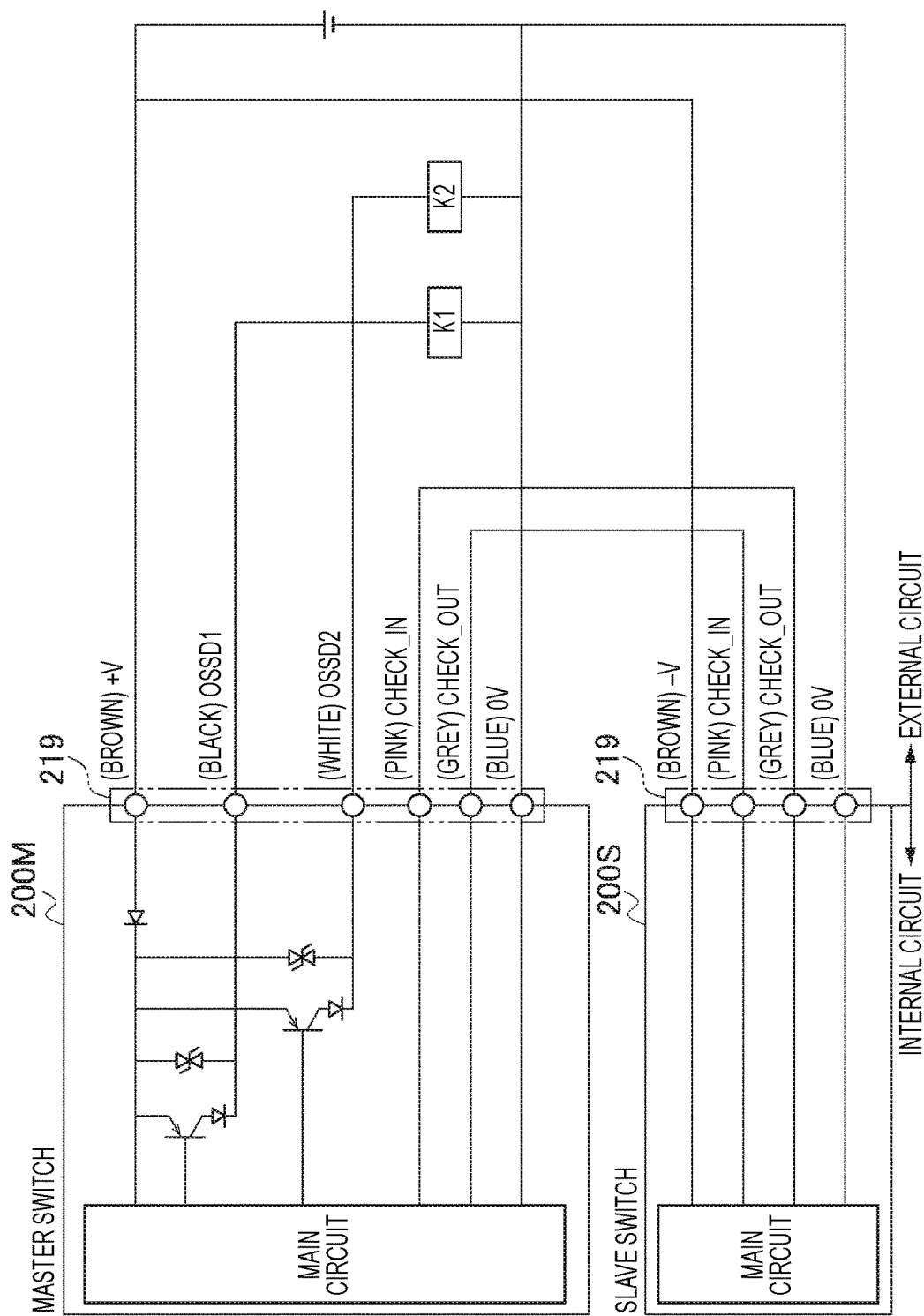
FIG. 4 is a diagram showing an example of each of signal lines connected to an input/output unit of the safety switch.

FIG. 4 is a diagram showing an example of each of the signal lines connected to the input/output unit 219 of the safety switch 200. FIG. 4 shows an example in which the master switch 200M and the slave switch 200S are connected to each other.

Power supply signal lines (+V and 0V), OSSD signal lines (OSSD1 and OSSD2), check signal lines (CHECK_IN and CHECK_OUT), and the like are connected to the input/output unit 219 of the master switch 200M. The power supply signal lines transmit the power supply signal. The OSSD signal lines transmit the abnormality detection signal from the master switch 200M to the safety PLC 400. The OSSD1 and the OSSD2 transmit the same signal. That is, the OSSD signal lines are duplicated. The check signal lines transmit at least one of the abnormality detection signal and the display control signal to and from the slave switch 200S. CHECK_IN is the input signal line, and CHECK_OUT is the output signal line.

The power supply signal lines (+V and 0V), the check signal lines (CHECK_IN and CHECK_OUT), and the like are connected to the input/output unit 219 of the slave switch 200S. The power supply signal lines transmit the power supply signal. The check signal lines transmit at least one of the abnormality detection signal and the display control signal to another slave switch 200S or master switch 200M. CHECK_IN is the input signal line, and CHECK_OUT is the output signal line.

As described above, the master switch 200M and the slave switch 200S are different in the number of signal lines through which the abnormality detection signal is transmitted. Specifically, the master switch 200M outputs the abnormality detection signal via the duplicated signal lines (OSSD1 and OSSD2). The slave switch 200S outputs the abnormality detection signal via the single signal line (CHECK_OUT).

It should be noted that a main circuit of the master switch 200M and a main circuit of the slave switch 200S include, for example, the processor 211. The display control signal and the abnormality detection signal may be transmitted through the physically different signal lines. That is, a plurality of check signal lines may be provided for each of input and output. Further, a color of each of the signal lines is not limited to the example of FIG. 4.

Next, generation of the display control signal will be described.

The master switch 200M acquires the detection result of another switch (slave switch) by acquiring the abnormality detection signal. The processor 211 of the master switch 200M also acquires the detection result of the own switch. The processor 211 of the master switch 200M generates the display control signal based on the detection result of another switch and the detection result of the own switch. In this case, when all of the detection result of another switch and the detection result of the own switch indicate the closed state, the processor 211 generates the display control signal including closing information. Further, when at least one of the detection result of another switch and the detection result of the own switch indicates the opening state, the processor 211 generates the display control signal including opening information. The input/output unit 219 of the master switch 200M outputs the generated display control signal to each of the slave switches 200S directly or indirectly.

Instead of the master switch 200M, the safety PLC may generate the display control signal. In this case, the processor of the safety PLC directly or indirectly outputs the generated display control signal to each of the safety switches 200 via the input/output unit of the safety PLC.

Next, a display example based on the display control signal of the safety switch 200 will be described.

The input/output unit 219 of each of the slave switches 200S receives the display control signal from the master switch 200M. Alternatively, the input/output unit 219 of each of the safety switches 200 (the master switch 200M and the slave switch 200S) receives the display control signal from the safety PLC.

The light source 213 may display based on at least one of the display control signal and the detection result of the own switch. In this case, the display mode of the light source 213 may be different depending on the number of light sources 213 in the display based on at least one of the display control signal and the detection result of the own switch.

First, a case in which the plurality of light sources 213 are provided will be described. Here, it is exemplified that the light source 213 includes two light sources of a first light source 213A and a second light source 213B.

The light source 213 can separately perform the display based on the detection result of the own switch and the display based on the display control signal. For example, the first light source 213A performs the display based on the detection result of the own switch, and the second light source 213B performs the display based on the display control signal.

When the detection result of the own switch indicates the closed state of the own door, the first light source 213A may display in a display mode DM1 (for example, lighting in green). Further, when the detection result of the own switch indicates the opening state of the own door, the first light source 213A may display in a display mode DM2 (for example, lighting in red).

When the display control signal includes the closing information, the second light source 213B may perform the display in the display mode DM1 (for example, lighting in green). Further, when the display control signal includes the opening information, the second light source 213B may display in the display mode DM2 (for example, lighting in red).

Next, a case in which one light source 213 is provided will be described.

The light source 213 simultaneously performs the display based on the detection result of the own switch and the display based on the display control signal. Therefore, it is preferable that the light source 213 performs the display with more variations of the display mode than in the case in which there are the plurality of light sources 213.

FIG. 5 is a diagram showing examples of the display mode by the single light source 213. In the display mode by the single light source 213, any one of two tables T1 and T2 shown in FIG. 5 may be applied.

For example, when the display control signal includes the closing information and the own switch detects the closed state, the light source 213 may display in the display mode DM1 (for example, lighting in green). When the own switch is in the opening state, the display control signal is the opening information. Therefore, there is no pattern in which the display control signal includes the closing information and the own switch detects the opening state.

When the display control signal includes the opening information, the light source 213 may display the light in a display mode DM3 (for example, lighting in yellow) regardless of whether the own switch detects the closed state or the opening state. Alternatively, when the display control signal includes the opening information, the light source 213 may display in a display mode DM4 (for example, blinking in green) when the own switch detects the closed state, and may display in the display mode DM2 (for example, lighting in red) when the own switch detects the opening state.

When the display control signal includes the opening information, the safety switch 200 displays the light in the display mode DM3, whereby the confirmer of the display of the display mode DM3 can recognize that any one of the safety switches 200 detects the opening state although the opening and closed state of the own door is unknown, and can take measures such as closing another door. It should be noted that the opening and closed state of the own door can be directly confirmed.

When the display control signal includes the opening information, the safety switch 200 displays the light in the display mode DM4, whereby the confirmer of the display in the display mode DM4 can recognize that the own door is in the closed state and any one of the safety switches 200 detects the opening state, and can take measures such as closing another door.

When the display control signal includes the opening information, the safety switch 200 displays the light in the display mode DM2, whereby the confirmer of the display in the display mode DM2 can recognize that the own switch detects the opening state although the opening and close state of another door is unknown. In the case of the display mode DM2, the confirmer can confirm whether another door is also opened by confirming the display mode of the own switch after closing the own door.

Next, connection relationships between the plurality of safety switches 200 and the safety PLC 400 will be described.

Figure 6:
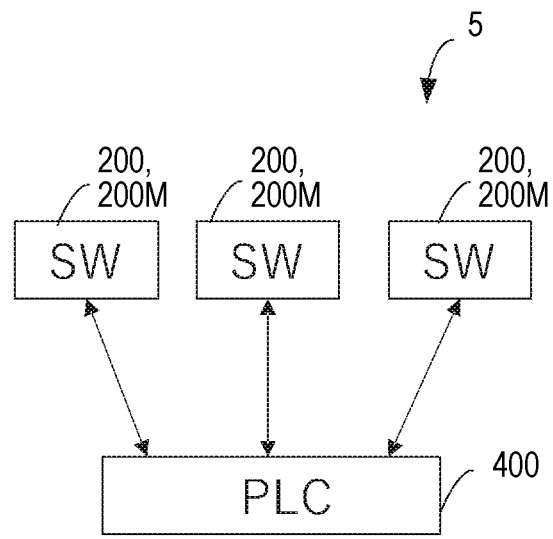
FIG. 6 is a diagram showing a first example of a connection relationship between a plurality of safety switches and a safety PLC.
Figure 7:
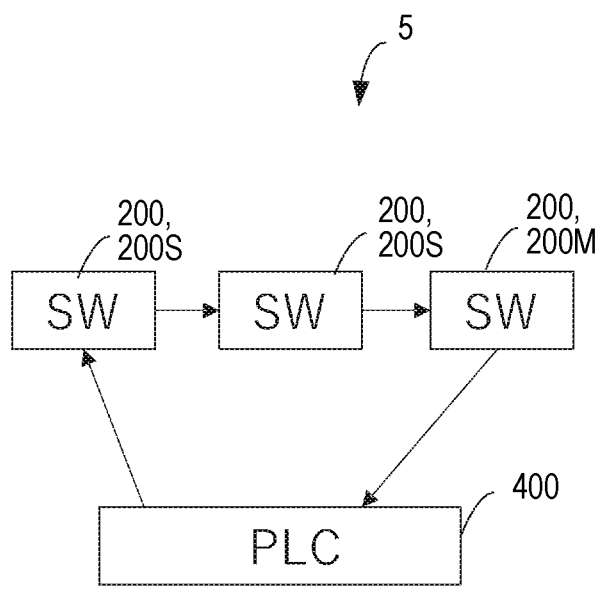
FIG. 7 is diagram showing a second example of the connection relationship between the plurality of safety switches and the safety PLC.
Figure 8:
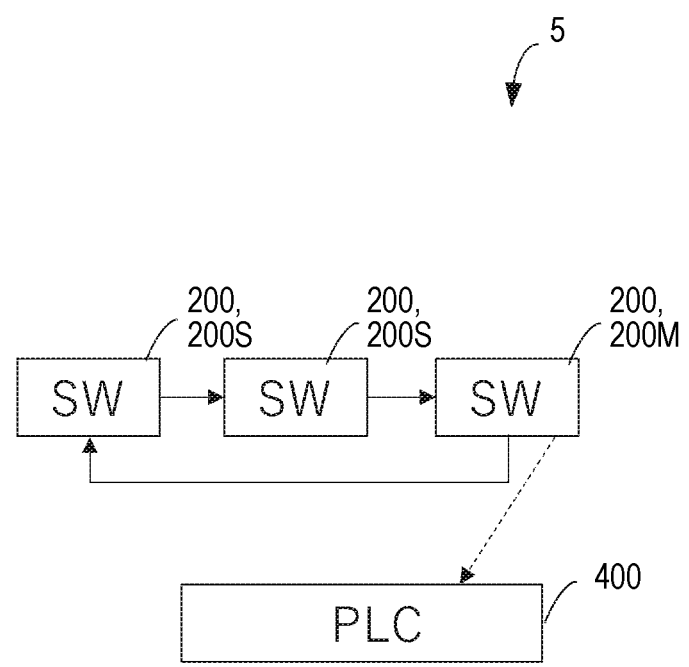
FIG. 8 is diagram showing a third example of the connection relationship between the plurality of safety switches and the safety PLC.

FIG. 6 is a diagram showing a first example of the connection relationship between the plurality of safety switches 200 and the safety PLC 400. FIG. 7 is a diagram showing a second example of the connection relationship between the plurality of safety switches 200 and the safety PLC 400. FIG. 8 is a diagram showing a third example of the connection relationship between the plurality of safety switches 200 and the safety PLC 400.

In FIG. 6, each of the safety switches 200 is connected to the safety PLC 400. In a case of FIG. 6, the display control signal is generated by the safety PLC 400. Since each of the safety switches 200 is the safety switch located immediately before the safety PLC 400, the safety switches 200 are the master switches 200M.

In FIG. 6, the input/output unit 219 of each of the safety switches 200 outputs the abnormality detection signal to the safety PLC 400. The input/output unit of the safety PLC 400 acquires the abnormality detection signal from each of the safety switches 200. The processor of the safety PLC 400 generates the display control signal based on the abnormality detection signal from each of the safety switches 200. The input/output unit of the safety PLC 400 outputs the display control signal to each of the safety switches 200. The input/output unit 219 of each of the safety switches 200 acquires the display control signal from the safety PLC 400.

According to the connection relationship shown in FIG. 6, the display control signal quickly reaches each of the safety switches 200, and a real-time performance of the display of each of the safety switches 200 is improved.

In FIG. 7, the safety switches 200 and the safety PLC 400 are connected in a ring shape and directly, that is, connected in a loop shape. In this case, the display control signal is generated by the safety PLC 400. It should be noted that in FIG. 7, the safety switch 200 of the last stage is the master switch 200M, and other safety switches 200 are the slave switches 200S.

In FIG. 7, the input/output unit 219 of each of the slave switches 200S outputs the abnormality detection signal to another adjacent switch of the subsequent stage. The input/output unit 219 of the master switch 200M outputs the abnormality detection signal to the safety PLC 400. The input/output unit of the safety PLC 400 acquires the abnormality detection signal from the master switch 200M. The processor of the safety PLC 400 generates the display control signal based on the acquired abnormality detection signal.

The input/output unit of the safety PLC 400 outputs the display control signal to the slave switch 200S of the first stage. The input/output unit 219 of the slave switch 200S of the first stage acquires the display control signal from the safety PLC 400 and outputs the display control signal to another adjacent switch (the slave switch 200S or the master switch 200M) of the subsequent stage. The input/output unit 219 of each of the slave switches 200S other than the slave switch of the first stage acquires the display control signal from the adjacent slave switch 200S, and outputs the display control signal to the adjacent other slave switch (the slave switch 200S or the master switch 200M) of the subsequent stage.

According to the connection relationship shown in FIG. 7, the safety PLC 400 does not need to individually perform communication of the abnormality detection signal and the display control signal with all the safety switches 200. Specifically, the abnormality detection signal may be acquired from the master switch 200M, and the display control signal may be output to the slave switch 200S of the first stage. Therefore, it is possible to reduce a load on the safety PLC 400 when the safety PLC 400 instructs display control.

In FIG. 8, the safety switches 200 are connected in the ring shape and directly, that is, connected in the loop shape. Then, the safety switch 200 of the final stage, that is, the master switch 200M is connected to the safety PLC 400. In this case, the display control signal is generated by the master switch 200M.

In FIG. 8, the input/output unit 219 of each of the slave switches 200S outputs the abnormality detection signal to another adjacent switch of the subsequent stage. The input/output unit 219 of the master switch 200M outputs the abnormality detection signal to the safety PLC 400. The input/output unit of the safety PLC 400 acquires the abnormality detection signal from the master switch 200M. The processor 211 of the master switch 200M generates the display control signal based on the acquired abnormality detection signal. The input/output unit 219 of the master switch 200M outputs the display control signal to each of the slave switches 200S directly or indirectly.

According to the connection relationship shown in FIG. 8, it is not necessary for the master switch 200M to individually perform communication of the abnormality detection signal with all the slave switches 200S. Specifically, it is sufficient that the abnormality detection signal is acquired from the adjacent slave switch 200S disposed at the previous stage.

Figure 9:
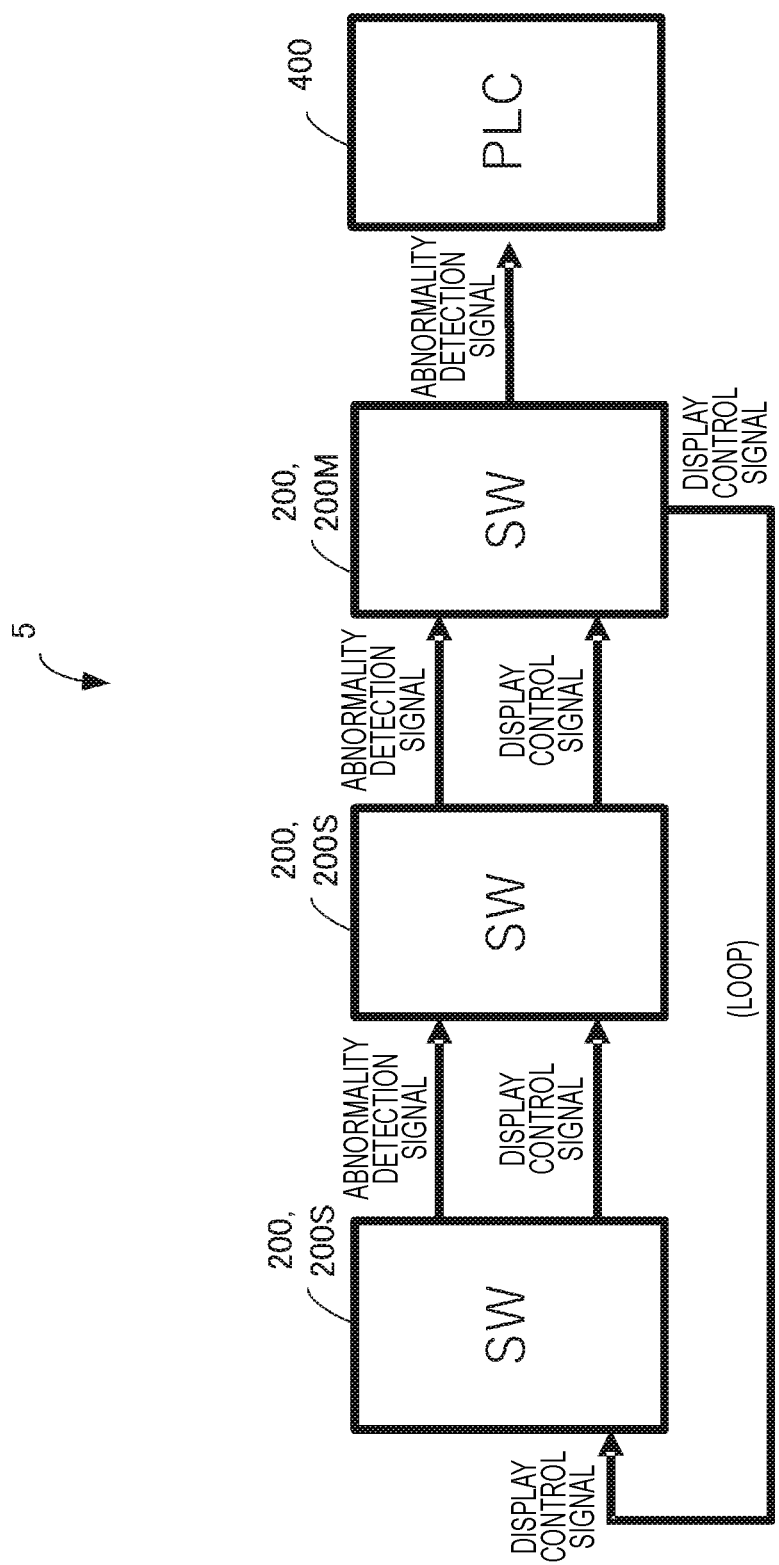
FIG. 9 is a diagram showing a first transmission example of a display control signal corresponding to the third example of the connection relationship between the plurality of safety switches and the safety PLC.

FIG. 9 is a diagram showing a first transmission example of the display control signal corresponding to the third example of the connection relationship between the plurality of safety switches 200 and the safety PLC 400 shown in FIG. 8. In FIG. 9, the abnormality detection signal is transmitted in the same manner as in FIG. 8. That is, the abnormality detection signal is transmitted in one direction to another switch of the subsequent stage or the safety PLC 400.

Meanwhile, the display control signal is transmitted from the master switch 200M which is a generation source to the slave switch 200S of the first stage, and then sequentially transmitted to another adjacent switch of the subsequent stage. That is, the input/output unit 219 of the slave switch 200S of the first stage acquires the display control signal from the master switch 200M, and outputs the display control signal to another adjacent switch (the slave switch 200S or the master switch 200M) of the subsequent stage. The input/output unit 219 of each of the slave switches 200S other than the slave switch of the first stage acquires the display control signal from the adjacent slave switch 200S of the previous stage, and outputs the display control signal to the adjacent other slave switch (the slave switch 200S or the master switch 200M) of the subsequent stage. Therefore, a transmission path of the display control signal is a loop path as shown in FIG. 9.

According to the transmission of the display control signal shown in FIG. 9, it is sufficient that the display control signal is output to the slave switch 200S of the first stage. Therefore, it is possible to reduce the load on the master switch 200M when the master switch 200M instructs display control.

Figure 10:
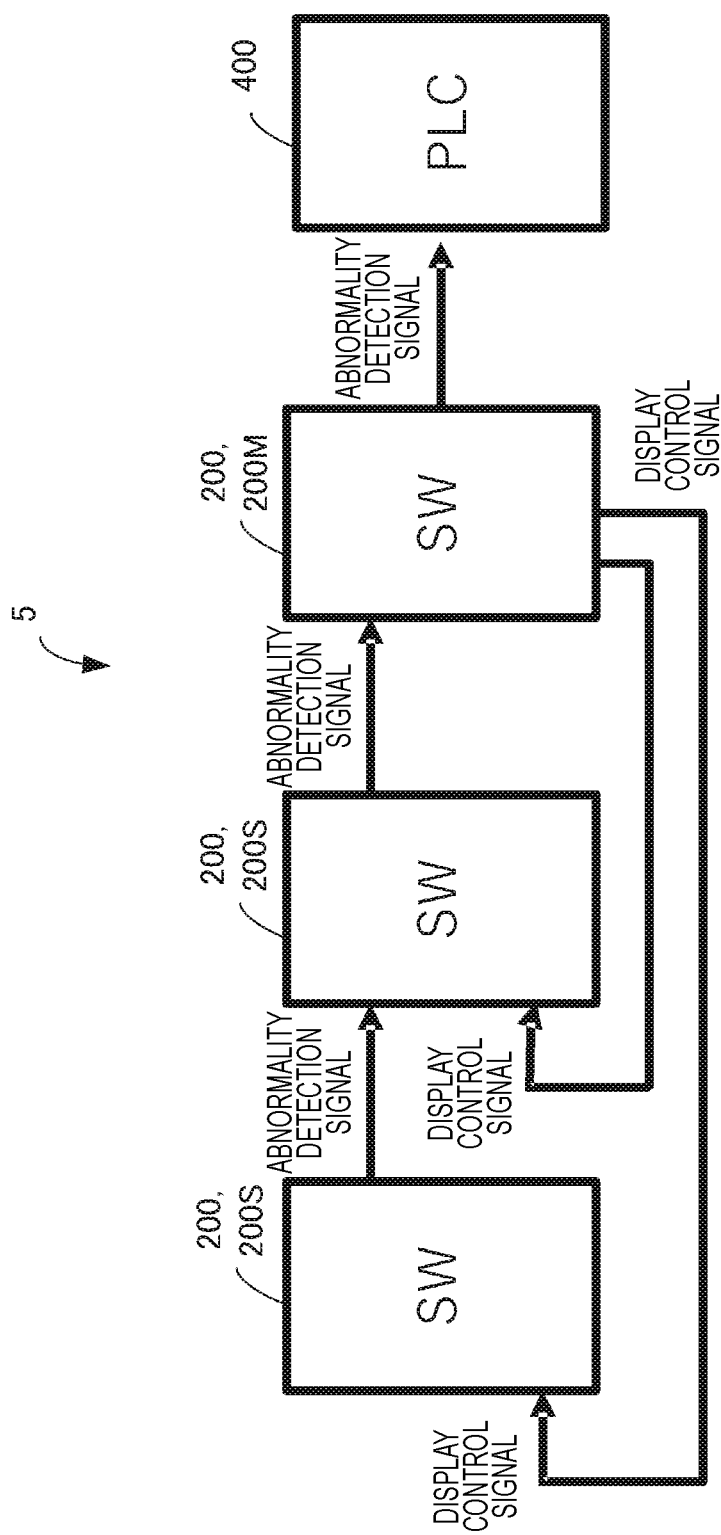
FIG. 10 is a diagram showing a second transmission example of the display control signal corresponding to the third example of the connection relationship between the plurality of safety switches and the safety PLC.

FIG. 10 is a diagram showing a first transmission example of the display control signal corresponding to the third example of the connection relationship between the plurality of safety switches 200 and the safety PLC 400 shown in FIG. 8. In FIG. 10, the abnormality detection signal is transmitted in the same manner as in FIG. 8. That is, the abnormality detection signal is transmitted in one direction to another switch of the subsequent stage or the safety PLC 400.

Meanwhile, the display control signal is directly transmitted from the master switch 200M which is the generation source to each of the slave switches 200S. That is, the input/output unit 219 of the master switch 200M outputs the display control signal to each of the slave switches 200S. The input/output unit 219 of each of the slave switches 200S acquires the display control signal from the master switch 200M. Therefore, the transmission path of the display control signal is not the loop path.

According to the transmission of the display control signal shown in FIG. 10, the display control signal quickly reaches each of the slave switches 200S, and real time property of the display of each of the slave switches 200S is improved.

Next, a display example of the plurality of safety switches 200 provided on the plurality of doors 100 will be described.

Figure 11:
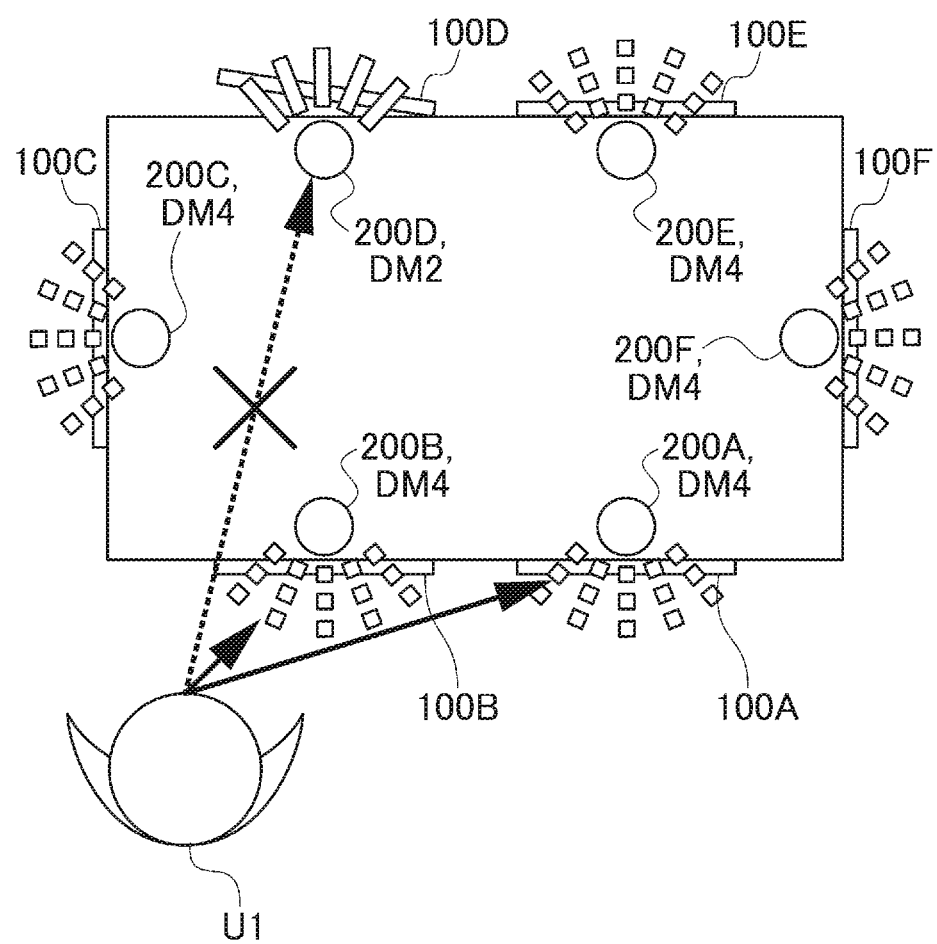
FIG. 11 is a diagram showing a first display example of the plurality of safety switches.

FIG. 11 is a diagram showing a first display example of the plurality of safety switches 200. In FIG. 11, similarly to FIG. 1, the plurality of doors 100 surround the manufacturing apparatus main body. The plurality of doors 100 include doors 100A, 100B, 100C, 100D, 100E, and 100F.

For example, when the door 100D is in the opening state, a safety switch 200D provided on the door 100D displays the light in the display mode DM2 (for example, lighting in red). In the doors 100A, 100B, 100C, 100E, and 100F other than the door 100D, the own doors are in the closed state, and the door 100D, which is one of other doors, is in the opening state. Therefore, safety switches 200A, 200B, 200C, 200E, and 200F other than the safety switch 200D display in the display mode DM4 (for example, blinking in green) based on the display control signal.

Accordingly, even when a confirmer U1 cannot directly confirm the display of the safety switch 200D provided on the door 100D, the confirmer U1 can recognize that any one of the doors 100 is in the opening state by confirming the safety switch 200A provided on the door 100A that can be confirmed or the safety switch 200B provided on the door 100B that can be confirmed. Therefore, the confirmer U1 can understand that the door 100D is in the opening state by going to a position of the door 100 that cannot be directly confirmed and confirming, for example, the display of the safety switch 200D. Therefore, the confirmer U1 can take measures such as closing the door 100D, and for example, can safely operate the manufacturing apparatus.

Figure 12:
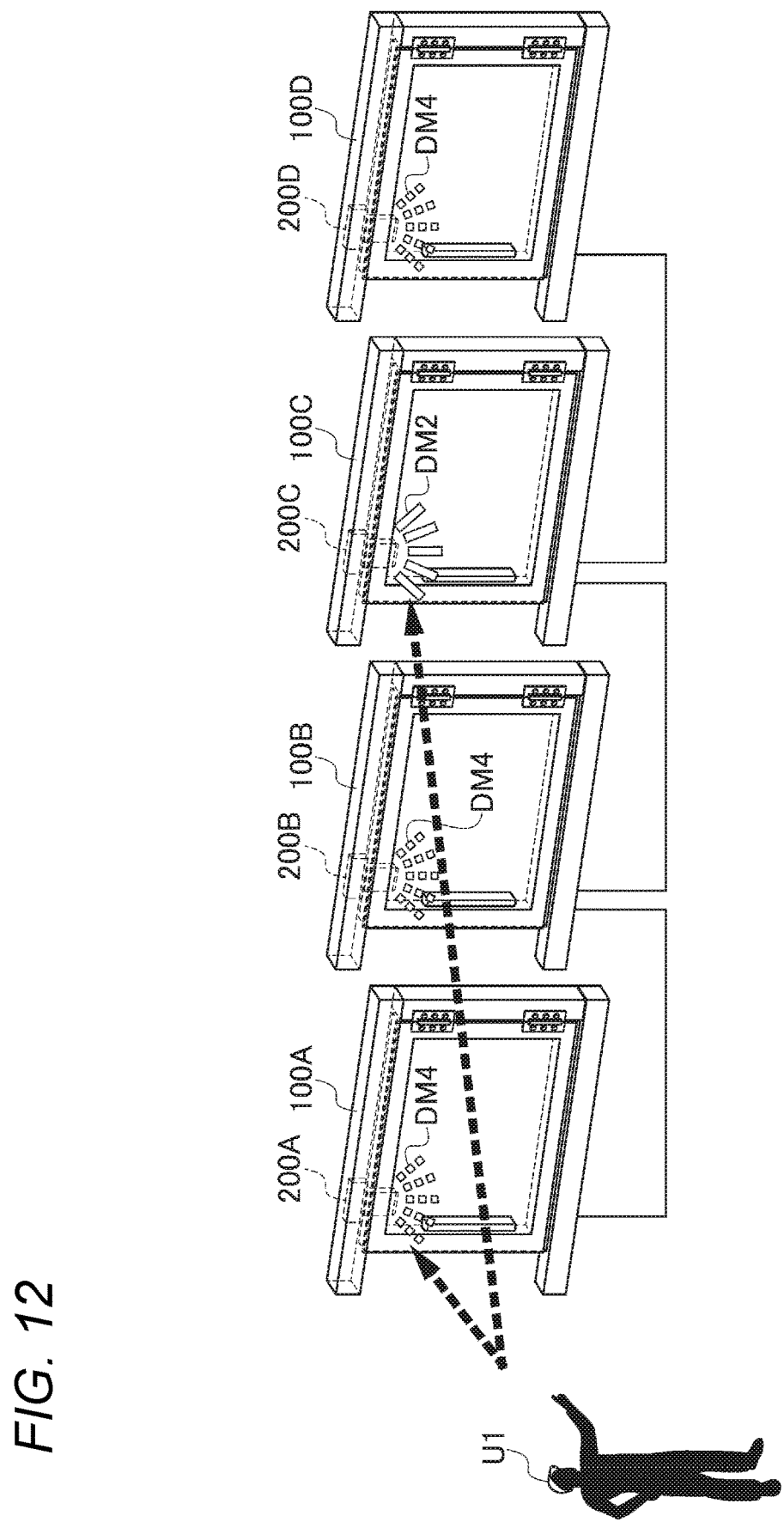
FIG. 12 is a diagram showing a second display example of the plurality of safety switches.

FIG. 12 is a diagram showing a second display example of the plurality of safety switches 200. In FIG. 12, the plurality of doors 100 are linearly arranged. The plurality of doors 100 include the doors 100A, 100B, 100C, and 100D. Here, it is assumed that the plurality of doors 100 are arranged in the depth direction when viewed from the confirmer.

For example, when the door 100C is in the opening state, the safety switch 200C provided on the door 100C displays the light in the display mode DM2 (for example, lighting in red). In the doors 100A, 100B, and 100D other than the door 100C, the own doors are in the closed state, and the door 100C which is one of other doors, is in the opening state. Therefore, the safety switches 200A, 200B, and 200D other than the safety switch 200C display in the display mode DM4 (for example, blinking in green) based on the display control signal.

Accordingly, even when the confirmer U1 cannot directly confirm the display of the safety switch 200C provided on the door 100C disposed on the rear surface side of the doors 100A and 100B, the confirmer U1 can recognize that any one of the doors 100 is in the opening state by confirming the safety switch 200A provided on the door 100A that can be confirmed. Therefore, the confirmer U1 can understand that the door 100C is in the opening state by going to the position of the door 100 that cannot be directly confirmed and confirming, for example, the display of the safety switch 200C. Therefore, the confirmer U1 can take measures such as closing the door 100C, and for example, can safely operate the manufacturing apparatus.

Next, the display by each of the safety switches will be described in comparison between a comparative example and the present embodiment. It should be noted that each of components of the safety switch of the comparative example is shown with "X" added to ends of reference numerals.

Figure 13:
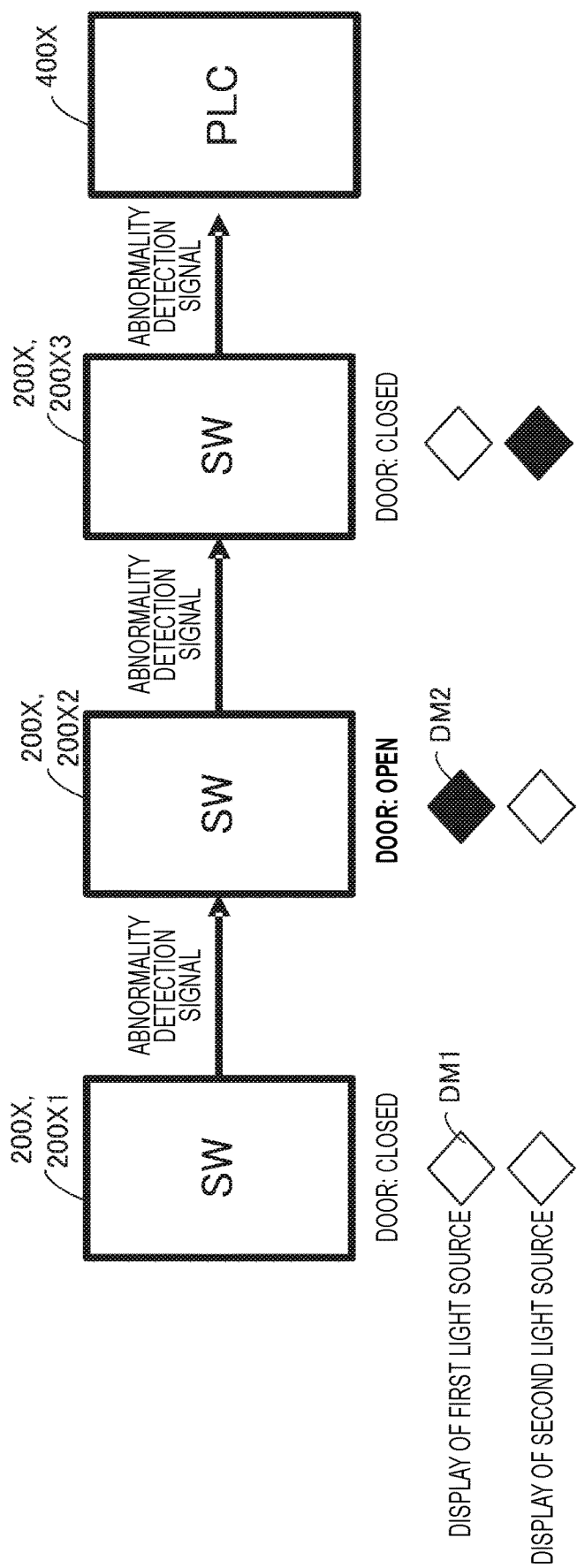
FIG. 13 is diagram showing display based on an abnormality detection signal in a plurality of safety switches in a comparative example.

FIG. 13 is a diagram showing display based on the abnormality detection signal in a plurality of safety switches 200X in the comparative example. In the comparative example, each of the safety switches 200X outputs the abnormality detection signal to other switches of the subsequent stage, but does not output the display control signal. A light source 213X includes a first light source 213X1 and a second light source 213X2. In each of the safety switches 200X, the first light source 213X1 displays the light based on the detection result of the own switch. The second light source 213X2 displays the light based on the abnormality detection signal indicating the detection result of other switch up to the previous stage.

In FIG. 13, a safety switch 200X1, a safety switch 200X2, a safety switch 200X3, and a safety PLC 400X are connected in series in this order from the previous stage. In FIG. 13, only a door 100X2 on which the safety switch 200X2 is provided is in the opening state. Therefore, the safety switch 200X2 and the safety switch 200X1 of the previous stage acquire the abnormality detection signal including the closing information. The safety switch 200X3 of the subsequent stage of the safety switch 200X2 acquires the abnormality detection signal including the opening information. The safety switch 200X3 outputs the abnormality detection signal including the opening information to the safety PLC 400X.

Therefore, in the safety switch 200X1, the first light source 213X1 displays the light in the display mode DM1 (for example, lighting in green), and the second light source 213X2 displays the light in the display mode DM1. In the safety switch 200X2, the first light source 213X1 displays the light in the display mode DM2 (for example, lighting in red), and the second light source 213X2 displays the light in the display mode DM1. In the safety switch 200X3, the first light source 213X1 displays the light in the display mode DM1, and the second light source 213X2 displays the light in the display mode DM2.

Therefore, in the safety switch 200X1 in the comparative example, even if the first light source 213X1 and the second light source 213X2 are confirmed, it is not possible to determine whether other safety switches 200X detect the abnormality, that is, whether other doors 100X are opened.

Figure 14:
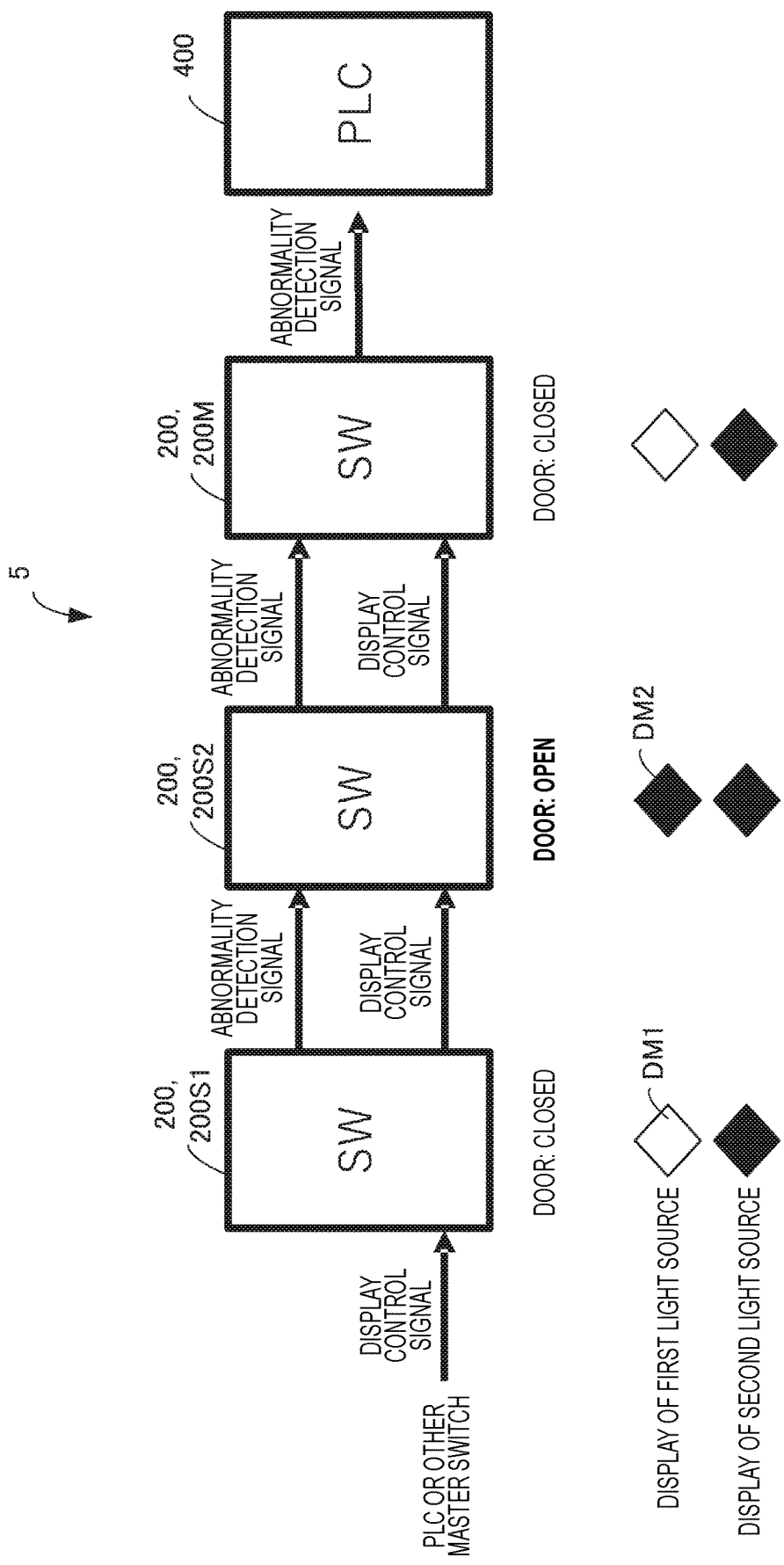
FIG. 14 is a diagram showing a display example based on a display control signal in the plurality of safety switches according to the embodiment.

FIG. 14 is a diagram showing a display example based on the display control signal in the plurality of safety switches 200 according to the embodiment. In the present embodiment, each of the safety switches 200 outputs the abnormality detection signal to another switch of the subsequent stage, and also outputs the display control signal. The light source 213 includes the first light source 213A and the second light source 213B. In each of the safety switches 200, the first light source 213A displays the light based on the detection result of the own switch. The second light source 213B displays the light based on the display control signal indicating the detection results of all the other switches.

In FIG. 14, a slave switch 200S1, a slave switch 200S2, the master switch 200M, and the safety PLC 400 are connected in series in this order from the previous stage. In FIG. 14, only the door 100B on which the slave switch 200S2 is provided is in the opening state. Therefore, the slave switch 200S2 and the slave switch 200S1 of the previous stage acquire the abnormality detection signal including the closing information. The master switch 200M of the subsequent stage of the slave switch 200S2 acquires the abnormality detection signal including the opening information. The master switch 200M outputs the abnormality detection signal including the opening information to the safety PLC 400. The master switch 200M or the safety PLC 400 generates the display control signal including the opening information. The generated display control signal is transmitted to, for example, the slave switch 200S1, the slave switch 200S2, and the master switch 200M in this order.

Therefore, in the slave switch 200S1, the first light source 213A displays the light in the display mode DM1, and the second light source 213B displays the light in the display mode DM2. In the slave switch 200S2, the first light source 213A displays the light in the display mode DM2, and the second light source 213B displays the light in the display mode DM2. In the master switch 200M, the first light source 213A displays the light in the display mode DM1, and the second light source 213B displays the light in the display mode DM2.

As described above, according to the safety switches 200 of the present embodiment, similarly to the comparative example, it is possible to recognize and display that there is an abnormality in another switch of the subsequent stage of the safety switch 200 having the abnormality. Further, the safety switch 200 can recognize and display that there is the abnormality in another switch of the subsequent stage by performing display based on the display control signal even in the previous stage of the safety switch having the abnormality. Therefore, the safety switch 200 can grasp the detection result of other switch regardless of an arrangement order of other switch, and can improve the display accuracy of the presence or absence of the abnormality in consideration of the presence or absence of the abnormality detected by another safety switch.

For example, there is a case where the door-equipped apparatus 10 is large in scale and the confirmer cannot directly confirm the door 100 or the safety switch 200 by visual observation. In this case, it is very advantageous that a situation of another safety switch can be grasped by display of the visually recognizable safety switch 200. By the safety switch 200 according to the present embodiment, a state of each of the safety switches 200 can be grasped with high accuracy, and for example, the manufacturing apparatus main body can be appropriately and safely operated.

Next, a safety output of each of the safety switches 200X will be described in comparison between the comparative example and the present embodiment. It should be noted that each of components of the safety switch of the comparative example is shown with "X" added to ends of reference numerals.

Figure 15:
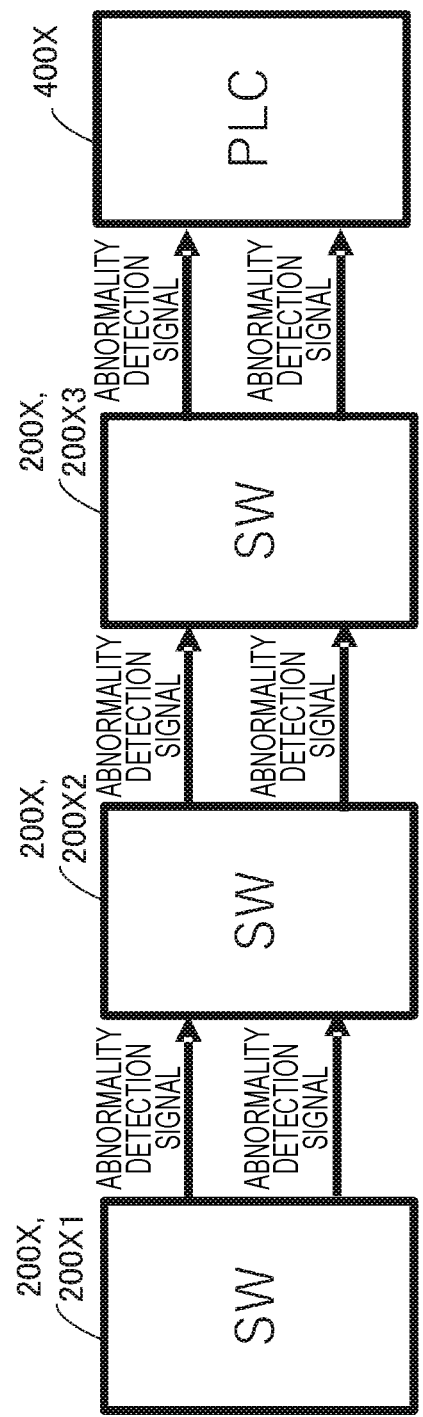
FIG. 15 is a diagram showing an output of an abnormality detection signals in the plurality of safety switches in the comparative example.

FIG. 15 is a diagram showing outputs of the abnormality detection signals in the plurality of safety switches 200X in the comparative example.

In FIG. 15, the safety switch 200X1, the safety switch 200X2, the safety switch 200X3, and the safety PLC 400X are connected in series in this order from the previous stage. The input/output unit 219X of each of the safety switches 200X1, 200X2, and 200X3 outputs the abnormality detection signal to the safety switch 200X of the subsequent stage or the safety PLC 400X via the duplicated signal lines (OSSD1 and OSSD2).

In this way, the safety switches 200X in the comparative example output the abnormality detection signal through the duplicated signal lines in all the safety switches 200X. Therefore, configurations of the safety switches 200X are all the same.

Figure 16:
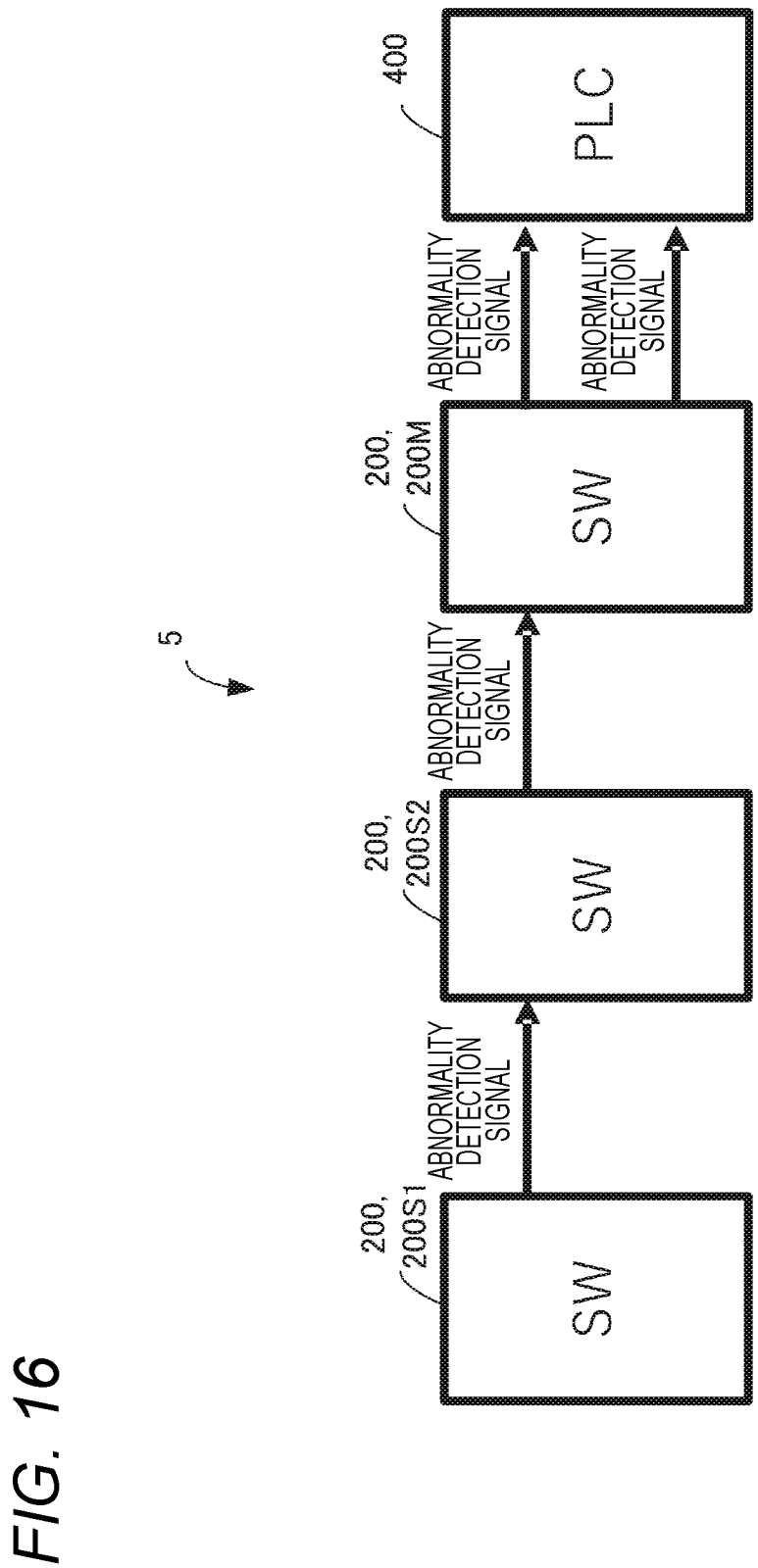
FIG. 16 is a diagram showing an output example of an abnormality detection signal in the plurality of safety switches according to the embodiment.

FIG. 16 is a diagram showing an output example of the abnormality detection signal in the plurality of safety switches 200 according to the present embodiment. It should be noted that in FIG. 16, the output of the display control signal is omitted.

In FIG. 16, the slave switch 200S1, the slave switch 200S2, the master switch 200M, and the safety PLC 400 are connected in series in this order from the previous stage. Each of the slave switches 200S1 and 200S2 outputs the abnormality detection signal to the safety switch 200 (the slave switch 200S2 and the master switch 200M) of the subsequent stage via the single signal line (CHECK_OUT). In contrast, the master switch 200M outputs the abnormality detection signal to the safety PLC 400 of the subsequent stage via the duplicated signal lines (OSSD1 and OSSD2).

In this way, according to the switch system 5 of the present embodiment, in the slave switches 200S which are the safety switches other than the safety switch of the last stage among the plurality of safety switches 200, the signal line through which the abnormality detection signal is transmitted is single, and in the master switch 200M which is the safety switch of the last stage among the plurality of safety switches 200, the signal line through which the abnormality detection signal is transmitted is duplicated. Therefore, the slave switches 200S can simplify the configuration of the switch as the safety switches having less trouble in a safety output. Further, the master switch 200M can maintain a safety output performance without simplifying the configuration of the switch as a safety switch having a high degree of importance in the safety output.

Although various embodiments have been described above with reference to the drawings, it is needless to say that the present invention is not limited thereto. It will be apparent to those skilled in the art that various changes and modifications can be conceived within the scope of the claims, and it is also understood that the various changes and modifications belong to the technical scope of the invention.

In addition, the respective components in the above-described embodiments may be optionally combined within a range not departing from the scope of the present invention.

In the above-described embodiment, the door-equipped apparatus 10 surrounds the manufacturing apparatus by the doors 100, and the present disclosure is not limited thereto. For example, lockers (for example, delivery lockers) may be disposed instead of the manufacturing apparatus. Further, the doors 100 may simply surround a predetermined space. That is, the door-equipped apparatus 10 may simply partition the space.

In the above embodiment, the safety switches 200 detect the opening and closed state of the doors 100 as the detection of the presence or absence of the abnormality, and the present disclosure is not limited thereto. An abnormality other than the opening and closed state of the doors 100 may be detected.

In the above-described embodiment, the safety switches 200 are provided on the back sides of the doors 100, but the present disclosure is not limited thereto, and the safety switches 200 may be provided on the front sides of the doors 100. In addition, although the door main bodies 113 are formed of, for example, the light transmissive members, the door main bodies 113 may be formed of non-light-transmissive members.

The processor may be freely and physically configured in the embodiment described above. When a programmable processor is used, processing contents can be changed by changing a program, and thus a degree of freedom in designing the processor can be increased. The processor may be configured with one semiconductor chip, or may be physically configured with a plurality of semiconductor chips. When the processor is configured with a plurality of semiconductor chips, controls in the embodiment described above may be respectively implemented by different semiconductor chips. In this case, it can be considered that one processor is configured with the plurality of semiconductor chips. The processor may be configured with a semiconductor chip and a member (such as a capacitor) having a different function. One semiconductor chip may be configured to implement a function of the processor and another function. A plurality of processors may be implemented by one processor.

As described above, in the embodiment, the safety switch 200 includes the detection unit that detects the presence or absence of the abnormality, the output unit (for example, the input/output unit 219) that outputs the abnormality detection signal indicating the detection result of the presence or absence of the abnormality, the input unit (for example, the input/output unit 219) that inputs the display control signal, and the display unit (for example, the light source 213) that performs display based on the display control signal.

Accordingly, the safety switch 200 handles the abnormality detection signal based on the detection result of the presence or absence of the abnormality of a part of other switches and the display control signal as different signals, and thus can perform display control based on the display control signal without being related to the abnormality detection signal. Therefore, even when in the plurality of safety switches 200 connected in series, the safety switch 200 is disposed at the stage preceding the safety switch 200 in which the abnormality is detected (absence of abnormality is detected), the safety switches 200 can perform the display by acquiring the display control signal regardless of an arrangement order of the safety switches 200 in which the abnormality is detected. Therefore, the safety switch 200 can improve the display accuracy of the presence or absence of the abnormality in consideration of the presence or absence of the abnormality detected by other switches.

The display control signal may be based on the detection result of the presence or absence of the abnormality by each of the safety switch 200 (own switch) and another safety switch 200 (another switch).

Accordingly, the safety switch 200 can reliably display that the abnormality occurs in at least one of the safety switches 200 by acquiring the display control signal.

The display unit may perform the display based on the display control signal and the detection result of the presence or absence of the abnormality detected by the detection unit.

Accordingly, the safety switch 200 can perform the display in consideration of the display control signal and the detection result of the presence or absence of the abnormality of the own switch. It should be noted that this display may be performed by the display based on the display control signal and the display based on the detection result of the presence or absence of the abnormality of the own switch being performed by separate display units, or may be performed in a display mode in which information of both the display based on the display control signal and the display based on the detection result of the presence or absence of the abnormality of the own switch is taken into consideration by one display unit.

In a case in which the display control signal indicates that the abnormality is detected by at least one of of the safety switch 200 and another safety switch 200, the display unit may perform the display in a display mode different from that in a case in which the display control signal indicates that no abnormality is detected by all of the safety switch 200 and another safety switch 200.

Accordingly, the safety switch 200 can implement confirmation of the safety switch in which the abnormality is detected in each of the safety switches at a glance, and the confirmer for the display can quickly respond to the abnormality. The confirmer can recognize, for example, the detection result of the presence or absence of the abnormality of the safety switch 200 disposed at an invisible position by confirming the display mode of the display of the visible safety switch 200.

The display unit may display the information indicating that the abnormality is detected by the detection unit in a case in which the abnormality is detected by the detection unit.

Accordingly, the safety switch 200 can explicitly display the detection result of the own switch. In this case, the safety switch 200 may display the detection result of the own switch in a display mode different from the display mode of the display based on the display control signal.

The safety switch 200 may be provided on the door 100. The detection unit may detect the opening and closed state of the door 100.

Accordingly, the safety switch 200 can perform the display based on the opening and closed state of the own door or another door on which the own switch or another switch is provided.

Further, the switch system 5 according to the above-described embodiment includes the above-described plurality of safety switches 200. The plurality of safety switches 200 include the master switch 200M (an example of a first safety switch) and the slave switch 200S (an example of a second safety switch). The output unit of the slave switch 200S outputs the detection result of the presence or absence of abnormality detected by the detection unit of the slave switch 200S to the master switch 200M. The master switch 200M includes a control unit (for example, the processor 211) that outputs the display control signal to the slave switch 200S based on the detection result of the presence or absence of the abnormality detected by the detection unit of the master switch 200M and the detection result of the presence or absence of the abnormality output by the slave switch 200S.

Accordingly, in the switch system 5, the master switch 200M among the plurality of safety switches 200 can aggregate the detection results of the presence or absence of the abnormality by the safety switches 200, and can generate and output the display control signal in consideration of the detection results of the safety switches 200. Therefore, the master switch 200M can output the display control signal based on the detection result of the presence or absence of the abnormality by each of the own switch and another switch, which is different from the abnormality detection signal based on the detection result of the presence or absence of the abnormality of a part of other switches. Therefore, the predetermined safety switch 200 can improve the display accuracy of the presence or absence of the abnormality in consideration of the presence or absence of the abnormality detected by other switches.

The plurality of safety switches 200 may be connected in a ring shape and in series.

Accordingly, the plurality of safety switches 200 are loop-connected. Therefore, the master switch 200M does not need to communicate with each of the slave switches 200S. For example, the signal may be output to the slave switch 200S of the first stage and input from the slave switch 200S of the last stage. Therefore, the load of the input/output of the master switch 200M can be reduced.

The output unit of the master switch 200M may output the abnormality detection signal via the duplicated signal line. The output unit of the slave switch 200S may output the abnormality detection signal via the single signal line.

Accordingly, the switch system 5 can maintain the performance of the safety output by the master switch 200M while simplifying the configuration of the slave switch 200S.

The switch system 5 according to the above-described embodiment includes the plurality of safety switches 200. Each of the plurality of safety switches 200 may include the detection unit that detects the presence or absence of the abnormality, and the output unit that outputs the abnormality detection signal indicating the detection result of the presence or absence of the abnormality. The plurality of safety switches 200 are connected in series and include the master switch 200M (the example of the first safety switch) disposed at the last stage, and the slave switches 200S (an example of the second safety switch) disposed at positions other than the last stage. The output unit of the master switch 200M outputs the abnormality detection signal via the duplicated signal line. The output unit of the slave switch 200S outputs the abnormality detection signal via the single signal line.

Accordingly, the switch system 5 can maintain the performance of the safety output by the master switch 200M while simplifying the configuration of the slave switch 200S. Therefore, it is possible to satisfy the safety performance while reducing a cost of the entire system. In addition, even when the control device (for example, the safety PLC 400) that acquires the abnormality detection signal from the master switch 200M controls an operation of a predetermined manufacturing apparatus in accordance with the abnormality detection signal, it is possible to prevent a decrease in safety by notification of the abnormality detection signal with high reliability.

Although the present disclosure has been described in detail with reference to the specific embodiment, it will be apparent to those skilled in the art that various changes and modifications can be made without departing from the spirit and scope of the present disclosure. The present disclosure is based on Japanese Patent Application (patent application number: 2020-010408) filed on Jan. 24, 2020, and the contents thereof are incorporated herein as reference.

INDUSTRIAL APPLICABILITY

The present disclosure is useful for a safety switch, a switch system, and the like capable of improving display accuracy of the presence or absence of the abnormality in consideration of the presence or absence of the abnormality detected by other safety switches.

REFERENCE SIGNS LIST 5 switch system
10 door-equipped apparatus
100 door
111 fixed frame
112 movable frame
113 door main body
200 safety switch
200M master switch
200S slave switch
210 sensor main body
211 processor
212 coil
213 light source
219 input/output unit
250 actuator
280 RFID tag
400 safety PLC

What is claimed is:

1. A safety switch comprising:
an actuator; and
a sensor main body facing the actuator,
wherein the sensor main body includes a coil, and the actuator includes an RFID tag,
wherein the coil and the RFID tag are configured to detect presence or absence of abnormality, and
the sensor main body is configured to output an abnormality detection signal indicating a detection result of the presence or absence of the abnormality, and to input a display control signal;
wherein the sensor main body further includes a display unit configured to perform display based on the display control signal, and
wherein the coil and the RFID tag are configured to detect the presence or absence of the abnormality based on a state in which the sensor main body and the actuator are close to each other, and
wherein the display control signal includes closing information if all of the coils and the RFID tags of a plurality of safety switches each corresponding to the safety switch detect absence of abnormality in the respective safety switch and includes opening information otherwise.

2. The safety switch according to claim 1,
wherein the display control signal is based on the detection result of the presence or absence of the abnormality by each of the safety switch and another safety switch.

3. The safety switch according to claim 1,
wherein the display unit performs the display based on the display control signal and the detection result of the presence or absence of the abnormality detected by the coil and the RFID tag.

4. The safety switch according to claim 1,
wherein in a case in which the display control signal indicates that the abnormality is detected by at least one of the safety switch and the another safety switch, the display unit performs the display in a display mode different from that in a case in which the display control signal indicates that no abnormality is detected by all of the safety switch and the another safety switch.

5. The safety switch according to claim 1,
wherein the display unit displays information indicating that the abnormality is detected by the coil and the RFID tag in a case in which the abnormality is detected by the coil and the RFID tag.

6. The safety switch according to claim 1,
wherein the safety switch is provided on a door, and
wherein the coil and the RFID tag are configured to detect an opening and closed state of the door.

7. A switch system comprising:
a plurality of safety switches, each of the plurality of safety switches being the safety switch according to claim 1,
wherein the plurality of safety switches comprise a first safety switch and a second safety switch,
wherein the sensor main body of the second safety switch outputs, to the first safety switch, the detection result of the presence or absence of the abnormality detected by the coil and the RFID tag of the second safety switch, and
wherein the first safety switch comprises a control unit configured to output the display control signal to the second safety switch based on the detection result of the presence or absence of the abnormality detected by the coil and the RFID tag of the first safety switch and the detection result of the presence or absence of the abnormality output by the second safety switch.

8. The safety system according to claim 7,
wherein the plurality of safety switches are connected in a ring shape and in series.

9. The safety system according to claim 7,
wherein the sensor main body of the first safety switch is configured to output the abnormality detection signal via a duplexed signal line, and
wherein the sensor main body of the second safety switch is configured to output the abnormality detection signal via a single signal line.

10. A switch system comprising:
a plurality of safety switches,
wherein each of the plurality of safety switches comprises:
an actuator; and
a sensor main body facing the actuator,
wherein the sensor main body is configured to input a display control signal, and
wherein the sensor main body includes a coil, and the actuator includes an RFID tag, wherein the sensor main body further includes a display unit configured to perform display based on the display control signal, wherein the sensor main body is configured to output an abnormality detection signal indicating a detection result of the presence or absence of the abnormality, wherein the plurality of safety switches are connected in series, the plurality of safety switches comprising a first safety switch disposed at a last stage and a second safety switch disposed at a position other than the last stage, wherein the sensor main body of the first safety switch is configured to output the abnormality detection signal via a duplexed signal line, wherein the sensor main body of the second safety switch is configured to output the abnormality detection signal via a single signal line, wherein the coil and the RFID tag are configured to detect the presence or absence of the abnormality based on a state in which the sensor main body and the actuator are close to each other, and the display control signal includes closing information if all of the coils and the RFID tags of the plurality of safety switches detect absence of abnormality in the respective safety switch and includes opening information otherwise.

11. The safety switch according to claim 1, wherein the coil and the RFID tag are configured to detect the presence or absence of the abnormality based on whether the coil receives a predetermined signal from the actuator.

12. The safety switch according to claim 1, wherein the coil and the RFID tag are configured to detect the presence or absence of the abnormality based on a state in which the coil and the RFID tag are close to each other.

13. The safety switch according to claim 1, wherein the safety switch is provided on a door having a fixed frame and a movable frame, wherein the sensor main body is provided on the fixed frame, and the actuator is provided on the movable frame, and wherein the coil and the RFID tag are configured to detect an opening and closed state of the door based on a state in which the sensor main body and the actuator are close to each other.

* * * * *